(12) United States Patent
Okabayashi et al.

(10) Patent No.: US 8,068,621 B2
(45) Date of Patent: Nov. 29, 2011

(54) CONTROLLER OF GRAPHIC EQUALIZER

(75) Inventors: Masaaki Okabayashi, Hamamatsu (JP); Shigeki Takahashi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1234 days.

(21) Appl. No.: 11/367,087

(22) Filed: Mar. 2, 2006

(65) Prior Publication Data

US 2006/0204021 A1    Sep. 14, 2006

(30) Foreign Application Priority Data

Mar. 10, 2005    (JP) ................. 2005-066731

(51) Int. Cl.
*H03G 5/00*    (2006.01)

(52) U.S. Cl. ........... 381/103; 381/98; 381/101; 381/102

(58) Field of Classification Search .............. 381/66, 381/93, 98, 101, 102, 103; 333/28 T
See application file for complete search history.

(56) References Cited

U.S. PATENT DOCUMENTS

| | | | | |
|---|---|---|---|---|
| 4,939,782 | A | * | 7/1990 | Gambacurta et al. .......... 381/103 |
| 5,210,806 | A | * | 5/1993 | Kihara et al. .................. 381/103 |
| 5,245,665 | A | * | 9/1993 | Lewis et al. ...................... 381/93 |
| 5,617,480 | A | * | 4/1997 | Ballard et al. ................... 381/98 |
| 2004/0071299 | A1 | * | 4/2004 | Yoshino ........................... 381/98 |

FOREIGN PATENT DOCUMENTS

| | | |
|---|---|---|
| EP | 1001652 | 5/2000 |
| EP | 1387487 | 4/2004 |
| JP | 3-150910 | 6/1991 |
| JP | 07106878 | 4/1995 |

OTHER PUBLICATIONS

Digital Audio Mixing System, Information Regarding PM1D, System Software V1.41, CS1D Reference Manual (Software) Ver. 1.41, Yamaha Corporation, Japan, pp. 13-16, entire manual can be accessed online from: http://www2.yamaha.co.jp/manual/pdf/pa/english/mixers/CS1DE.pdf.

* cited by examiner

*Primary Examiner* — Vivian Chin
*Assistant Examiner* — Friedrich W Fahnert
(74) *Attorney, Agent, or Firm* — Morrison & Foerster LLP (57) ABSTRACT

An apparatus is provided for controlling a graphic equalizer which is implemented by digital filters, each being assignable to a frequency band for regulating a level of the frequency band. In the apparatus, a set of control devices are provided in correspondence to respective frequency bands, each control device being operable to specify the level of the corresponding frequency band to either of a reference level or other level than the reference level. An assignment section operates when a number of the digital filters is less than a total number of the frequency bands, for assigning the digital filters to the frequency bands which are specified with the levels other than the reference level. A control section controls remaining digital filters which are not assigned to any of the frequency bands in a through state. A disabling section operates when the assignment section assigns all of the digital filters to the frequency bands which are specified with levels other than the reference level, for disabling operation of a control device which currently specifies the reference level.

7 Claims, 11 Drawing Sheets

| GEQ 1: BAND x | 1 | 2 | 3 | 4 | 5 | 6 | 7 | ... | 28 | 29 | 30 | 31 |
|---|---|---|---|---|---|---|---|---|---|---|---|---|
| FILTER AF(x) | 0 | 0 | 0 | 1 | 2 | 0 | 0 | ... | 0 | 13 | 14 | 0 |

FIG. 4(c)

| GEQ 2: BAND x | 1 | 2 | 3 | 4 | 5 | 6 | 7 | ... | 28 | 29 | 30 | 31 |
|---|---|---|---|---|---|---|---|---|---|---|---|---|
| FILTER AF(x) | 16 | 0 | 17 | 20 | 0 | 0 | 0 | ... | 0 | 29 | 30 | 0 |

CONTROLLER OF GRAPHIC EQUALIZER

BACKGROUND OF THE INVENTION

1. Technical Field

The present invention relates to a controller of a graphic equalizer using multiple control devices for specifying levels of multiple frequency bands.

2. Related Art

A graphic equalizer is a kind of tone controller that uses multiple control devices for specifying levels of multiple frequency bands (hereafter referred to simply as bands). Just looking at each control device's position can identify the corresponding frequency characteristic.

The following describes an example of using fader control devices as control devices assuming j to be 31, where 31 is the total number of bands and control devices, respectively.

FIGS. 9(a) through 9(d) are an explanatory diagram showing a conventional graphic equalizer. The following describes a case where a display device displays multiple fader control devices as symbolic images of GUI and a mouse tool is used to manipulate each fader control device through GUI.

Figure 9A:
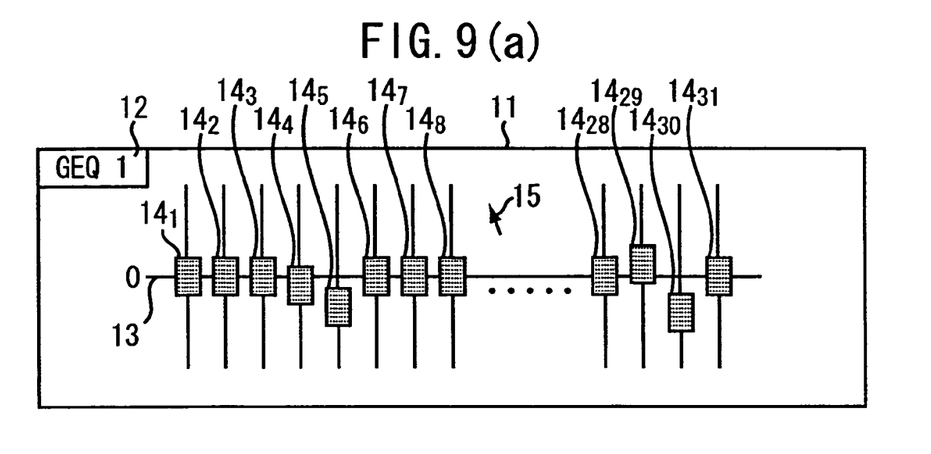
Figure 9B:
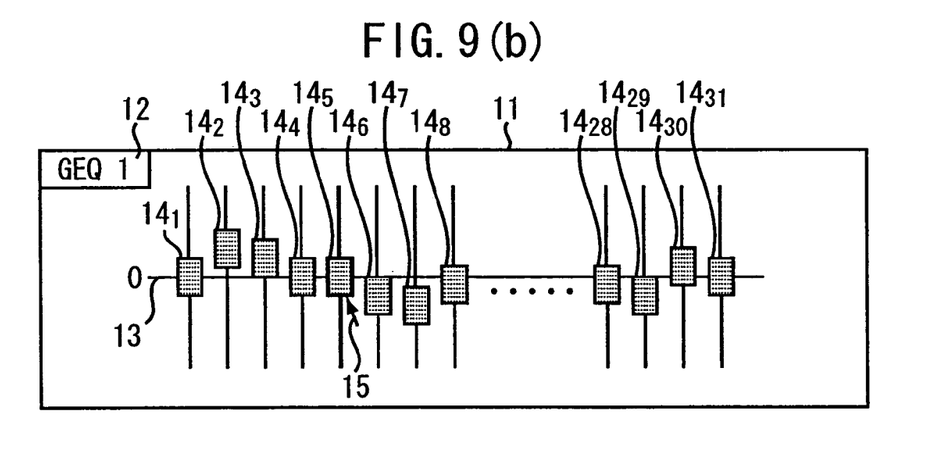

FIGS. 9(a) and 9(b) are explanatory diagram showing operation panel display screens.

Reference numeral 11 denotes an operation panel display screen; 12 denotes a display portion for graphic equalizer numbers; 13 denotes a reference line to indicate a reference level (neutral level 0 normally equivalent to 0 db); and $14_1$ through $14_{31}$ denote fader control devices corresponding to bands 1 through 31.

In FIG. 9(b), the mouse may be used to move the pointer 15 to fader control device $14_5$. Pressing a mouse button selects fader control device $14_5$. Its outline is displayed in a thick, red line to indicate that the fader control device is focused. Dragging the mouse vertically moves fader control device $14_5$. The level corresponds to the operated position after moving the fader control device. This level is assigned to a band No. 5 corresponding to fader control device $14_5$.

Figure 9C:
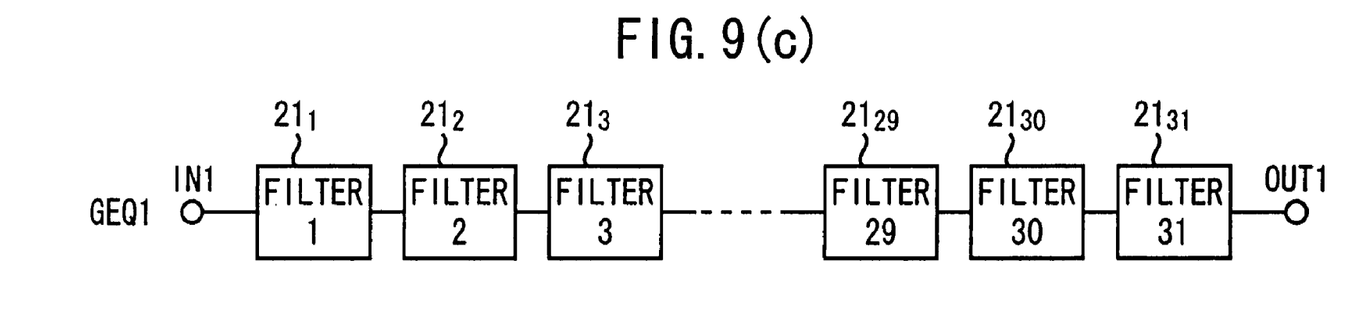

FIG. 9(c) is a block diagram showing graphic equalizer GEQ1 using as many digital filters as the total number of bands j.

Generally, graphic equalizer GEQ1 is implemented by serially connecting digital filters $21_1$ through $21_{31}$. The total transfer function of GEQ1 results from multiplying respective transfer functions of digital filters $21_1$ through $21_{31}$.

The digital filters $21_1$ through $21_{31}$ are permanently assigned to bands 1 through 31 in order. Each digital filter functions as a peaking filter that increases or decreases level G for the corresponding band from the reference level (i.e., neutral 0 db).

Figure 9D:
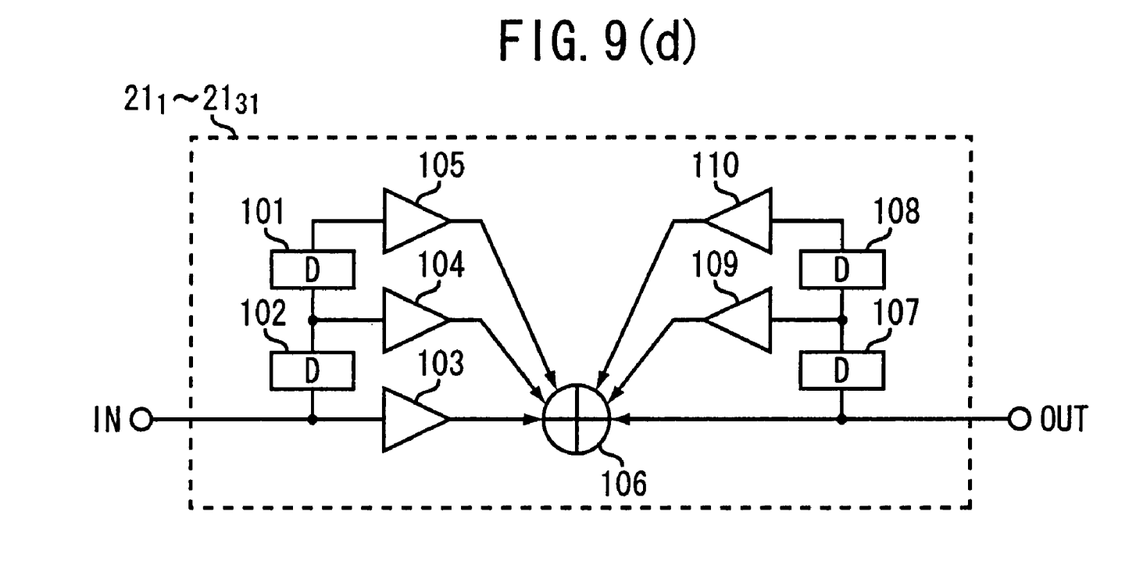

FIG. 9(d) is a block diagram exemplifying the inside configuration of each digital filter. For example, the digital filter is composed of an IIR (Infinite Impulse Response) filter. In FIG. 9(d), reference numerals 101, 102, 107, and 108 denote delay means with the transfer function set to $z^{-1}$; 103, 104, 105, 109, and 110 denote coefficient multiplier; and 106 denotes an adder.

Fader control devices $14_1$ through $14_{31}$ are used to specify levels for the respective bands. A coefficient value table is provided for each band. In accordance with the level specified for each band, referencing the coefficient value table obtains parameter values (coefficient values) to be set to the coefficient multipliers 103, 104, 105, and 109 to the control digital filters $21_1$ through $21_{31}$ assigned to the bands.

Selectivity Q is configured to increase as level G is set to be smaller or greater than the reference level. By contrast, selectivity Q is configured to decrease as level G is set to approximate to the reference level. In this manner, control is provided to maintain the bandwidth even though level G changes.

The digital mixer described in non patent document 1 uses a DSP (Digital Signal Processor) and is capable of individually inserting up to 24 numbers of 31-band graphic equalizers GEQs into any input or output channels.

When the DSP is used to implement the graphic equalizer GEQ having multiple digital filters, there is a limitation on the DSP throughput.

The graphic equalizer GEQ is not always used to manipulate all bands. When the graphic equalizer GEQ is inserted to suppress howling of a sound picked up through a microphone, for example, the graphic equalizer GEQ is operated for only a part of the multiple bands. In such case, however, the DSP must process signals of all the digital filters, causing a problem of loading the DSP with unnecessary processes.

[Non patent document 1] CS1D Reference Manual (Software) ver. 1.41, YAMAHA CORPORATION. See also pages 13 to 16 on the Internet online manual http://www2.yamaha.co.jp/manual/pdf/pa/english/mixers/CS1DE.pdf.

SUMMARY OF THE INVENTION

The present invention has been made in consideration of the foregoing. It is therefore an object of the present invention to provide a controller of graphic equalizer that efficiently and dynamically uses digital filters.

The present invention provides an apparatus for controlling a graphic equalizer which is implemented by digital filters, each being assignable to a frequency band for regulating a level of the frequency band, by means of a set of control devices provided in correspondence to respective frequency bands, each control device being operable to specify the level of the corresponding frequency band to either of a reference level or other level than the reference level, the inventive apparatus comprising: an assignment section operative when a number of the digital filters is less than a total number of the frequency bands, for assigning the digital filters to the frequency bands which are specified with the levels other than the reference level by the corresponding control devices; a control section that controls each digital filter assigned to each frequency band by the assignment section for regulating each frequency band to the level specified by the corresponding control device, and that controls remaining digital filters which are not assigned to any of the frequency bands in a through state; and a disabling section operative when the assignment section assigns all of the digital filters to the frequency bands which are specified with levels other than the reference level, for disabling operation of a control device which currently specifies the reference level.

In a preferred form, the disabling section holds all of the control devices which currently specify the reference level in a disabled state and visually indicates the disabled state of all the control devices which currently specify the reference level.

Accordingly, it is possible to efficiently use a limited number of the digital filters fewer than the total number of frequency bands for implementing the graphic equalizer. When the number of bands in which the levels should be regulated reaches to the maximum number of digital filters, a control device of a band corresponding to the reference level is disabled from operating and an indication is provided to notify that the operation is disabled. A user can be notified in advance of inability to operate the control device of the band corresponding to the reference level.

Alternatively, the disabling section operates when an attempt is made to operate the control device which currently specifies the reference level for inhibiting the operation of the control device and displaying warning that the operation is inhibited.

After the number of bands corresponding to levels to be regulated reaches the maximum number of digital filters, if an attempt is made to further operate some control device corresponding to a band set to the reference level, this operation is disabled and an indication is displayed to notify that the operation is disabled. A user can take action against inability to perform the current operation.

The inventive apparatus may further comprises a display control section that provides a set of graphic symbols corresponding to the set of the control devices, and that applies a first display mode to the graphic symbols corresponding to the control devices which specify other levels than the reference level and applies a second display mode different from the first display mode to the remaining graphic symbols corresponding to the control devices which specify the reference level.

Accordingly, it is possible to easily distinguish a control device capable of freely regulating band levels from others according to whether the corresponding symbol is set to a first display mode or second display mode.

This display mode may be controlled when or before inability to perform the current operation is visually indicated. In such a case, a user can easily stop the level regulating operation and select a control device for resuming the reference level.

Practically, the inventive apparatus may further comprise a mode setup section that enables a user to set either of two modes, a first mode being set to implement one graphic equalizer by a number of the digital filters which is not less than the total number of the frequency bands of the graphic equalizer, a second mode being set to implement two or more of graphic equalizers by the digital filters such that the number of the digital filters of one graphic equalizer is less than the total number of the frequency bands of the graphic equalizer. Under the first mode, the assignment section assigns the digital filters to all of the frequency bands in one to one correspondence, and the control section controls each digital filter to regulate each frequency band to the level specified by the corresponding control. On the other hand under the second mode, the assignment section assigns the digital filters only to the frequency bands which are specified with the levels other than the reference level, the control section controls the remaining digital filters which are not assigned to any of the frequency bands in the trough state, and the disabling section disables operation of a control device which currently specifies the reference level when the assignment section assigns all of the digital filters to the frequency bands which are specified with levels other than the reference level.

When selecting the first mode, the user can freely operate levels of all bands for one graphic equalizer. When selecting the second mode, the user can operate levels of bands of a practical number (not all) for two or more graphic equalizers.

The present invention provides the advantage of capability to implement the graphic equalizer by efficiently using digital filters. Especially when the number of frequency bands intended for level operations is smaller than or equal to the total number of digital filters, the graphic equalizer can be used completely similarly to a graphic equalizer equipped with digital filters for all frequency bands.

As a result, the total number of digital filters can be decreased. Even though the DSP throughput limits the total number of available digital filters, it is possible either to implement one graphic equalizer or to increase the number of simultaneously available graphic equalizers without changing the precision of the band.

BRIEF DESCRIPTION OF THE DRAWINGS

FIGS. 3($a$) and 3($b$) are an explanatory diagram showing the mode-2 operation panel display screen displayed in the display portion in FIG. 1.

FIGS. 4($a$), 4($b$) and 4($c$) are an explanatory diagram of the mode-2 graphic equalizer implemented by the signal processing portion 2 in FIG. 1.

FIGS. 5($a$) and 5($b$) are an explanatory diagram showing another example of the mode-2 operation panel display screen displayed on the display portion in FIG. 1.

FIGS. 6($a$) and 6($b$) are a first flowchart showing a process of the control portion in FIG. 1.

FIGS. 8($a$) and 8($b$) are an explanatory diagram showing another example of the mode-2 operation panel display screen displayed on the display portion in FIG. 1.

FIGS. 9($a$) through 9($d$) are an explanatory diagram showing a conventional graphic equalizer.

DETAILED DESCRIPTION OF THE INVENTION

Figure 1:
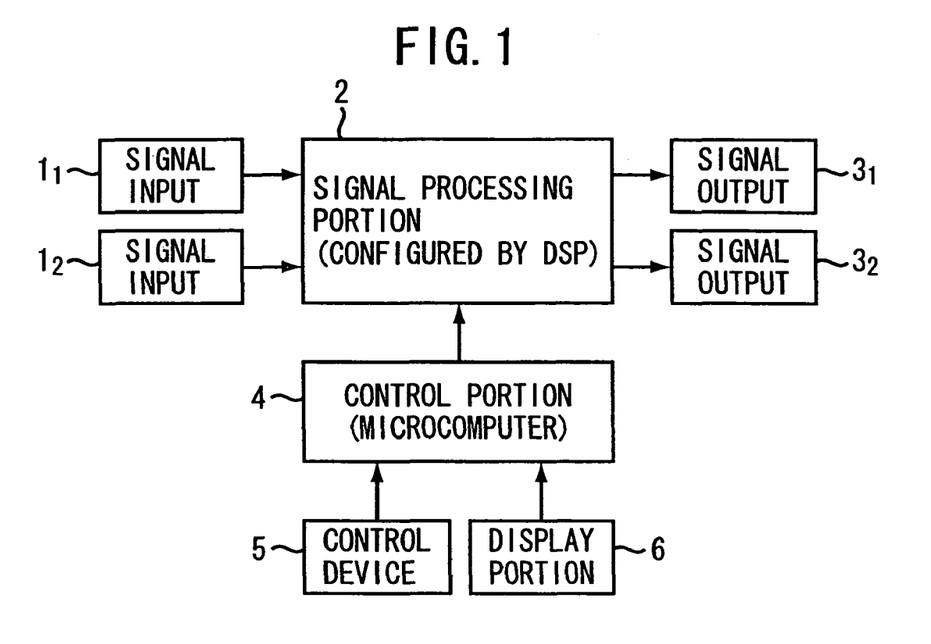
FIG. 1 is a block diagram showing the hardware configuration for describing an embodiment of the present invention.

FIG. 1 is a block diagram showing the hardware configuration for describing an embodiment of the present invention.

In FIG. 1, reference numerals $1_1$ and $1_2$ denote signal input terminals. The diagramatically illustrated example shows two processing channels. These processing channels are inserted into any of multiple input and output channels in a digital audio mixer, for example.

Reference numeral 2 denotes a signal processing portion. It processes digital audio signals supplied from the signal input terminals $1_1$ and $1_2$ according to the overall frequency characteristic of multiple digital filters constituting the graphic equalizer. The signal processing portion 2 outputs the signals from corresponding signal output terminals $3_1$ and $3_2$.

The signal processing portion 2 has a function equivalent to multiple (k) digital filters (hereafter referred to simply as filters). The signal processing portion 2 also has a function of creating one j-band graphic equalizer GEQ1 or multiple (i) j-band graphic equalizer GEQ1, GEQ2, and so on.

The signal processing portion 2 is implemented by operating the DSP according to a microprogram. The microprogram is used to form any number (k) of filters (j≦k). Multiple (m) filters are connected to be able to create any number (i) of graphic equalizers GEQs (m×i≦k).

Since the DSP throughput is limited, there is also a limitation on the total number (k) of filters to be implemented. Specifically, the following description assumes k=31, j=31, m=15, and i=2.

A pointing device such as a mouse is provided as a physical control device 5. An image display device such as a liquid crystal display is provided as a display portion 6. Both function as the GUI (Graphical User Interface).

A control portion 4 functions as a controller of the graphic equalizer. The control portion 4 allows the control device 5 to select an intended graphic equalizer, displays it on the display portion 6, and moves fader control device positions. In addition, the control portion 4 specifies each band level and passes specified parameters to the signal processing portion 2 to control it.

The control portion 4 has a mode selection function, a graphic equalizer creation control function, a band assignment function, a filter characteristic control function, and the like. These functions are implemented by operating a microcomputer (microprocessor) in accordance with a program. A machine readable medium such as ROM is incorporated in the control portion 4. The ROM contains a program executable by the microcomputer for performing a method of controlling a graphic equalizer which is implemented by digital filters.

Figure 2:
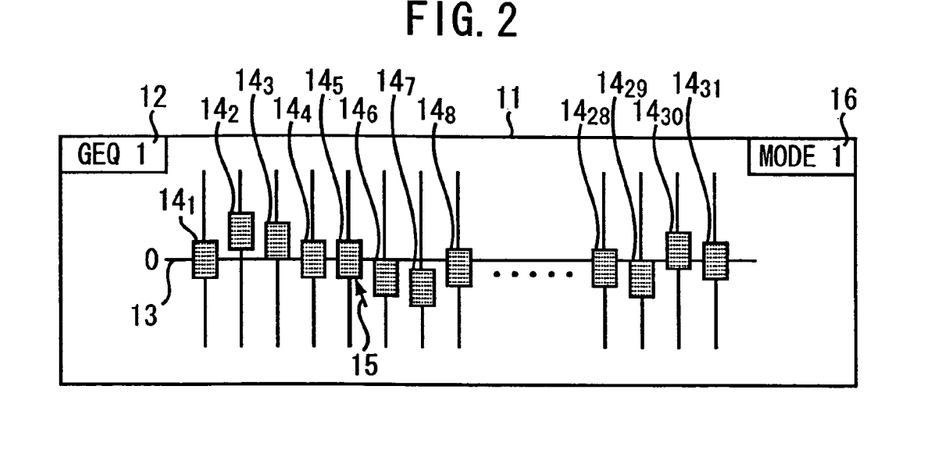
FIG. 2 is an explanatory diagram showing the mode-1 operation panel display screen displayed in the display portion in FIG. 1.
Figure 3A:
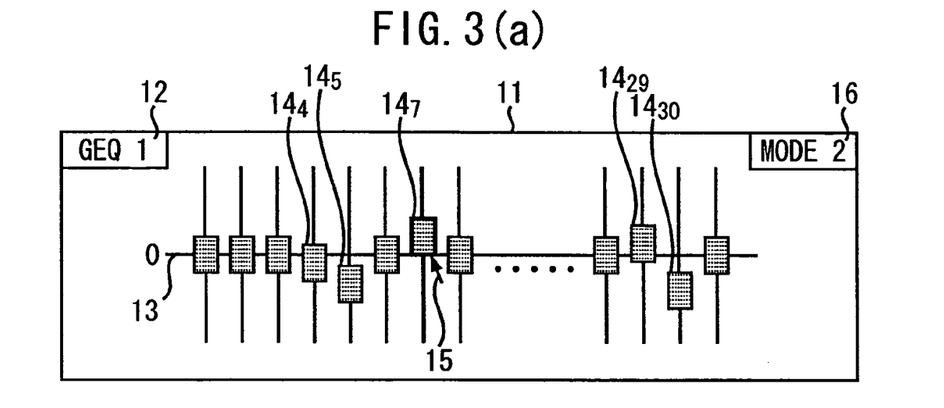
Figure 3B:
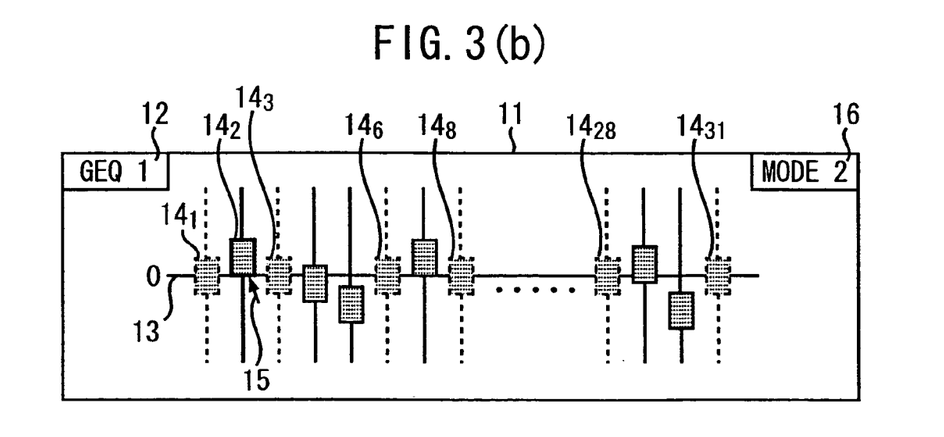

FIGS. 2, 3(a) and 3(b) are explanatory diagrams showing operation panel display screens displayed on the display portion 6 in FIG. 1.

The mode selection function of the control portion 4 in FIG. 1 allows a user to select one of two modes.

FIG. 2 is an explanatory diagram showing the mode-1 operation panel display screen.

FIG. 2 is the same as FIGS. 9(a) and 9(b) except that a mode display portion 16 is provided.

The mode-1 graphic equalizer GEQ1 shows the same function block diagram as FIG. 9(c).

In mode 1, the control portion 4 has the creation control function to implement one graphic equalizer GEQ1 by 31 number of digital filters $21_1$ through $21_{31}$ in the signal processing portion 2.

Similarly to the conventional technology described with reference to FIG. 9, the control portion 4 has the band assignment function that permanently assigns filters $21_1$ through $21_{31}$ to the bands 1 through 31.

The control portion 4 also has the characteristic control function. This function controls the signal processing portion 2 so that the bands 1 through 31 are regulated to assume the levels specified by the corresponding fader control devices $14_1$ through $14_{31}$.

FIGS. 3(a) and 3(b) are an explanatory diagram showing the mode-2 operation panel display screen.

FIG. 3(a) shows the display screen representing that the total number of fader control devices indicating levels other than the reference level is smaller than 15, i.e., the total number of digital filters assignable to the graphic equalizer GEQ1. That is, FIG. 3(a) indicates the same situation as mode 1 in FIG. 2. In the present embodiment, the fader control device is presented on the display screen in the form of graphic symbols, which is equivalent to a physical fader control device.

By contrast, FIG. 3(b) shows the display screen representing that the total number of fader control devices indicating levels other than the reference level equals 15, i.e., the total number of digital filters assignable to the graphic equalizer GEQ1.

Figure 4A:
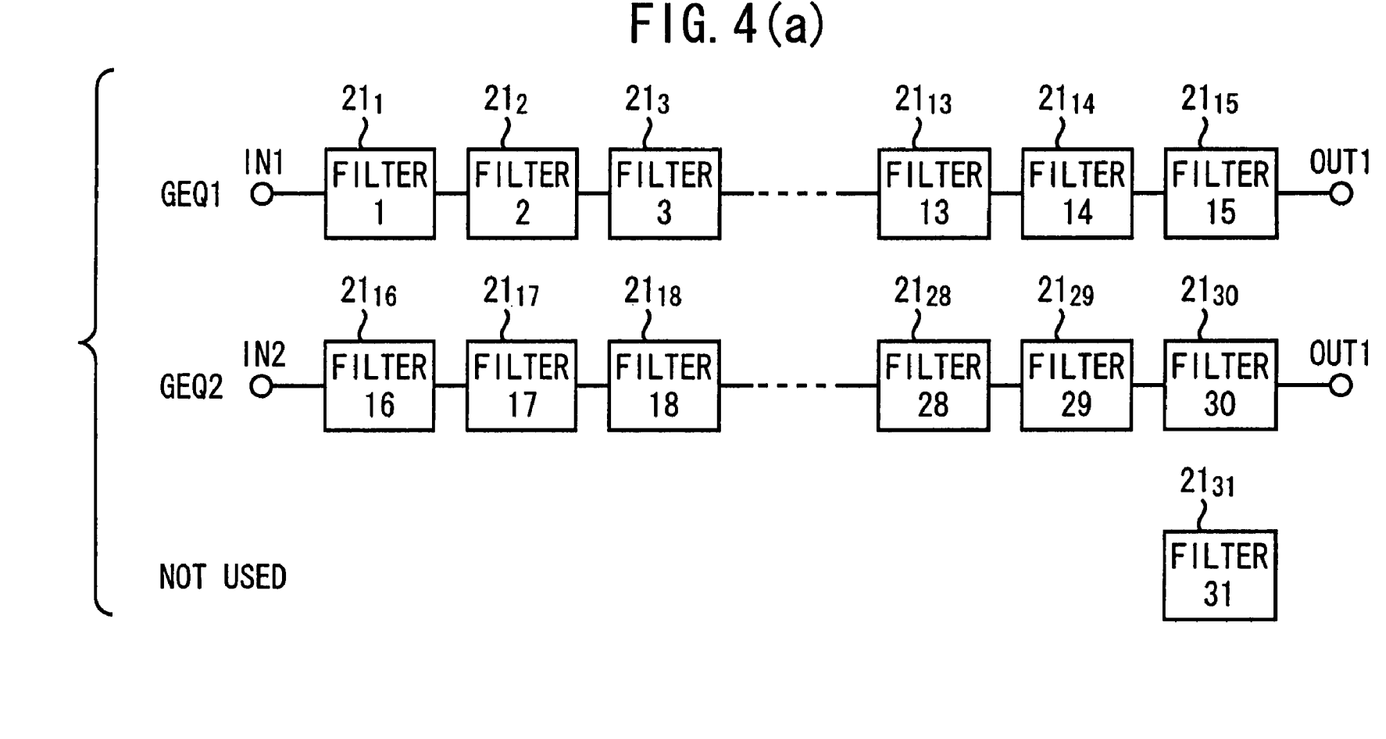
Figure 4B:
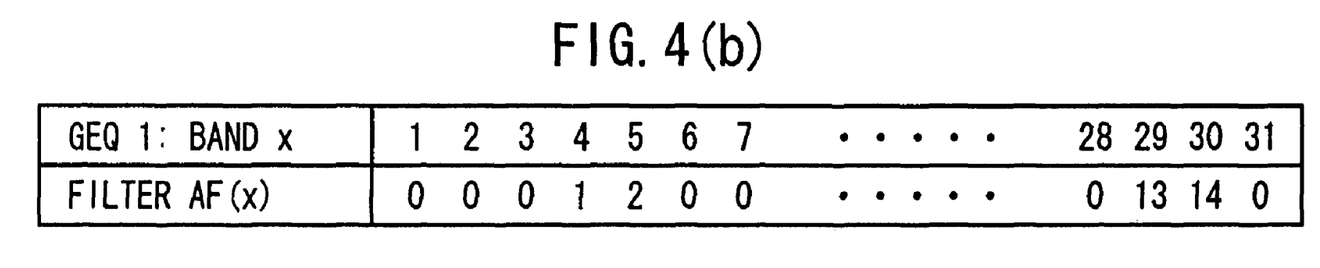

FIGS. 4(a) and 4(b) are an explanatory diagram of the mode-2 graphic equalizer implemented by the signal processing portion 2 in FIG. 1.

FIG. 4(a) is a block diagram showing the mode-2 graphic equalizer.

In mode 2, the control portion 4 in FIG. 1 has the creation control function. This function divides 31 filters in the signal processing portion 2 into two sets each composed of 15 filters, i.e., filters $21_1$ through $21_{15}$ and filters $21_{16}$ through $21_{30}$, to implement two graphic equalizers GEQ1 and GEQ2. The residual filter $21_{31}$ is unused.

The digital mixer can be used to insert the two graphic equalizers GEQ1 and GEQ2 into any channels in the input or output channel and independently control the graphic equalizers from each other.

In this example, the total number of digital filters, i.e., 15, is smaller than the total number of bands, i.e., 31. Consequently, the filters are dynamically assigned to the active bands.

The control portion 4 in FIG. 1 has the assignment function. This function at least assigns 15 filters of each of the created graphic equalizers GEQ1 and GEQ2 to bands provided with levels other than the reference level through the use of the fader control devices $14_1$ through $14_{31}$.

Figure 4C:
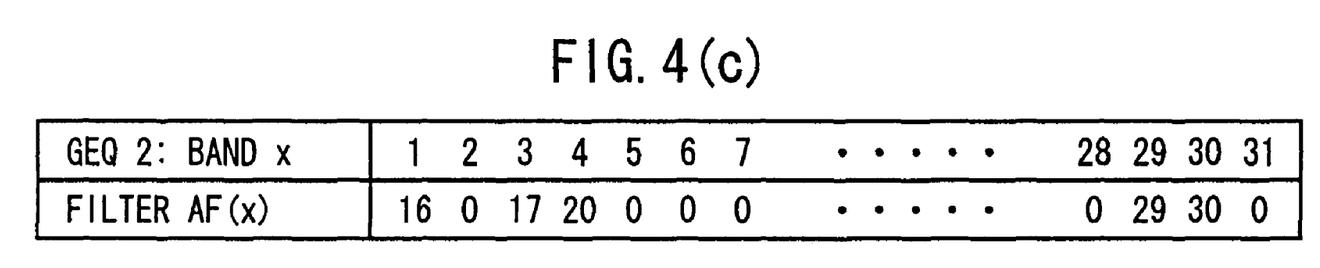

FIGS. 4(b) and 4(c) are explanatory diagrams of correspondence tables indicating filter AF(x) assigned to band x (fader control device $14_x$) in the graphic equalizers GEQ1 and GEQ2, respectively.

In the following description, variable x (x=1 through 31) is used to specify fader control device $14_x$ corresponding to band x. Function AF(x) (Assigned Filter AF (x)=1 through 15) is used to specify a filter corresponding to band x.

Even when filter AF(x) is assigned to band X that is specified with the reference level by fader control device $14_x$, the transfer function for that filter just needs to be set to 1 (a through state). No filter needs to be assigned.

For example, the fader control devices $14_4$, $14_5$, ..., $14_{29}$, and $14_{30}$ specify levels other than the reference level. Only for these fader control devices, corresponding bands 4, 5, ..., 29, and 30 are assigned to any filter AF(x)=1, 2, ..., 13, and 14, for example. Bands can be assigned to any filters (i.e., unused filters) that are not assigned to the bands indicating levels other than the reference level.

AF(x)=0 is assumed for band x specifying the reference level to indicate that no filter is assigned.

When an unused filter is available, it may be assigned to the band provided with the reference level until this filter becomes necessary.

To implement the above-mentioned assignment function, the control portion 4 stores the correspondence tables in FIGS. 4(b) and 4(c) in current memory of RAM (Random Access Memory).

Instead of the above-mentioned correspondence table, it may be preferable to use a correspondence table indicating band x (fader control device $14_x$) assigned to each filter AF(x)=1 through 15. In this case, it just needs to assume band x=0 for unused filter AF(x).

The control portion 4 has the characteristic control function to control the signal processing portion 2 as follows. The corresponding control devices $14_4$, $14_5$, ..., $14_{29}$, and $14_{30}$ are used to assign the filters $21_4$, $21_5$, ..., $21_{29}$, and $21_{30}$ with the bands 4, 5, ..., 29, and 30 indicating levels other than the reference level. These filters are set to specified levels corresponding to the bands. When unassigned filters remain, transfer function=1 is assumed for these filters to hold the through state.

To implement the above-mentioned characteristic control function, the mode-2 control portion 4 obtains a parameter value corresponding to the level value of band x assigned to the filter AF(x) (AF(x)=1 through 15) for each of the graphic equalizers GEQ1 and GEQ2. The control portion 4 stores the parameter value in the current memory and transfers the parameter value to the signal processing portion 2 for control.

According to the example in FIG. 9(d), coefficient 1 is supplied to the coefficient multiplier 103 and coefficient 0 is supplied to the other coefficient multipliers 104, 105, 109, and 110 for a filter that corresponds to the band set to the reference level and that is placed in the through state.

By modifying the microprogram, the DSP to implement the signal processing portion 2 can create any number of filters. Any of these filters can be connected to implement any number of graphic equalizers.

In modes 1 and 2, the same algorithm is used for individual filter processes performed by the signal processing portion 2. Different filters are used to receive input signals and extract signal outputs. What is necessary is only to change wire connections between the filters. Accordingly, modes 1 and 2 use the same microprogram itself for the filter processes.

According to the above-mentioned description, the filters are permanently assigned to all bands in mode 1 similarly to the conventional technology. Therefore, the assignment process is simple. However, similarly to mode 2, an unassigned filter may be assigned to a given band each time the band is supplied with a level other than the reference level. Even when that band is returned to the reference level thereafter, sufficient filters are available in mode 1. It is needless to release the assignment just by providing the characteristic control that set the assigned filters to the reference level.

The graphic equalizer GEQ divides an entire frequency range into many fine bands and enables their levels to be manipulated. In many case, however, users change levels from the reference level for only a part of all the bands.

When all bands need to be operated concurrently, the user selects mode 1 to use the graphic equalizer GEQ as a single graphic equalizer. When all bands do not need to be operated concurrently, the user selects mode 2 to modify the single graphic equalizer GEQ to multiple graphic equalizers.

However, it is desirable to consider a countermeasure against the case where the total number of filters becomes insufficient while mode 2 is used.

For this purpose, the control portion 4 in FIG. 1 has an operation disabling function. In this case, the operation panel provides the display as shown in FIG. 3(*b*).

Let us suppose that the fader control devices $14_1$, $14_3$, $14_6$, $14_8$, ..., $14_{28}$, and $14_{31}$ specify the reference level while all the filters $21_1$ through $21_{15}$ are assigned to the bands specified with levels other than the reference level. In this case, the operation disabling function prevents these fader control devices from being further operated to specify levels other than the reference level. In addition, the function uses the operation panel to visually indicate that these control devices are inoperable. According to the example in FIG. 3(*b*), the corresponding control devices in the form of graphic symbols are grayed out (in broken lines).

When the user attempts to operate the grayed-out fader control device, the user's operation is not accepted. The graphic symbol of the fader control devices may be not only grayed out, but also changed to different colors or shapes. Alternatively, the graphic symbol of the fader control devices may be prevented from being selected by the pointing device without changing their appearance.

Afterwards, the user can freely move the fader control devices $14_2$, $14_4$, $14_5$, ..., $14_{29}$, and $14_{30}$ that do not specify the reference level. Returning one of these fader control devices to the reference level makes it possible to move another grayed-out fader control device from the reference level.

An operation disabling example will be described later in detail with reference to a flowchart of FIG. 6.

The control portion 4 may be provided with an operation inhibiting function instead of the operation disabling function.

Figure 5A:
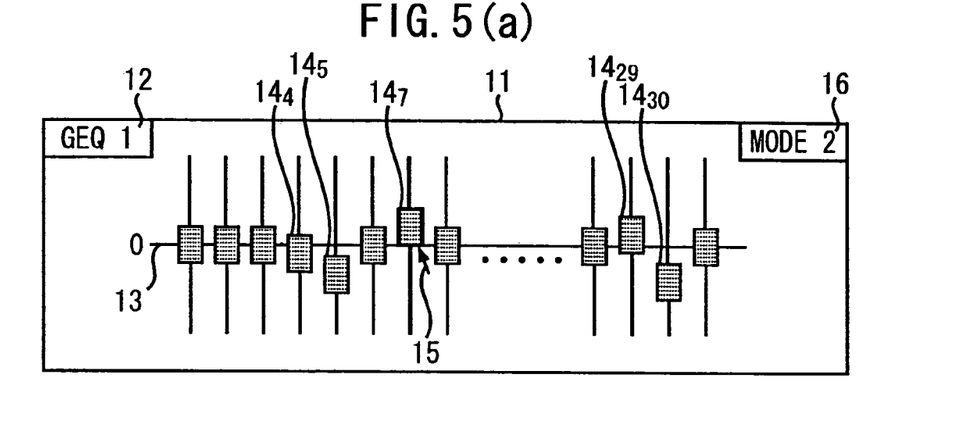
Figure 5B:
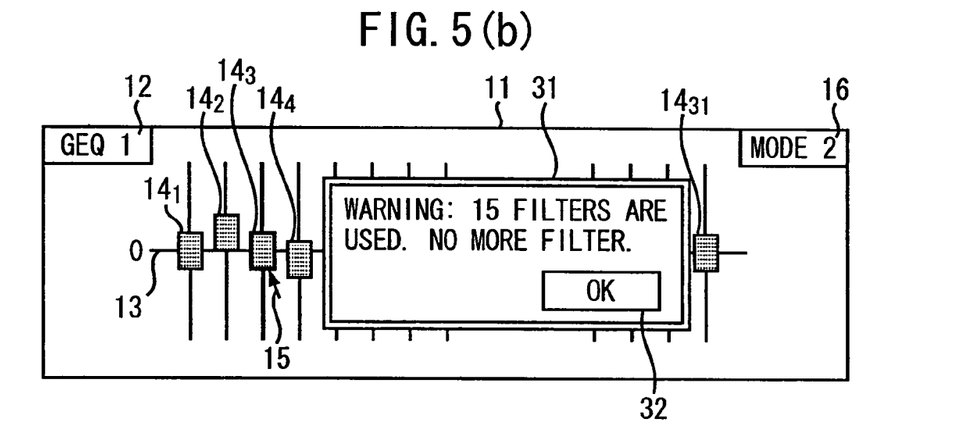

FIGS. 5(*a*) and 5(*b*) are an explanatory diagram showing another example of the mode-2 operation panel display screen displayed on the display portion 6 in FIG. 1.

FIG. 5(*a*) is an explanatory diagram of the operation panel display screen of the graphic equalizer GEQ1 that allows the corresponding fader control devices to set bands as many as or fewer than the number of the filters to levels other than the reference level. FIG. 5(*a*) is the same as FIG. 3(*a*).

By contrast, in FIG. 5(*b*), all filters $21_1$ through $21_{15}$ of the graphic equalizer GEQ1 are assigned to the bands set to levels other than the reference level. An attempt is made to specify a level other than the reference level by operating the fader control device $14_3$ indicating the reference level. The operation inhibiting function prevents the fader control device $14_3$ from being operated and visually notifies that the fader control device $14_3$ cannot be operated.

For example, the operation inhibiting function prevents the fader control device $14_3$ from moving and activates a pop-up window 31. This window shows a warning message indicating that the filters are insufficient and that the selected control device cannot specify a level different from the reference level. Mouse-clicking on an [OK button] 32 dismisses the pop-up window 31 itself.

The warning message may be provided by other display methods. It may be preferable to provide audible warning by means of a warning sound or an audio message.

An operation inhibiting example will be described later in detail with reference to FIGS. 7 and 8.

Figure 6A:
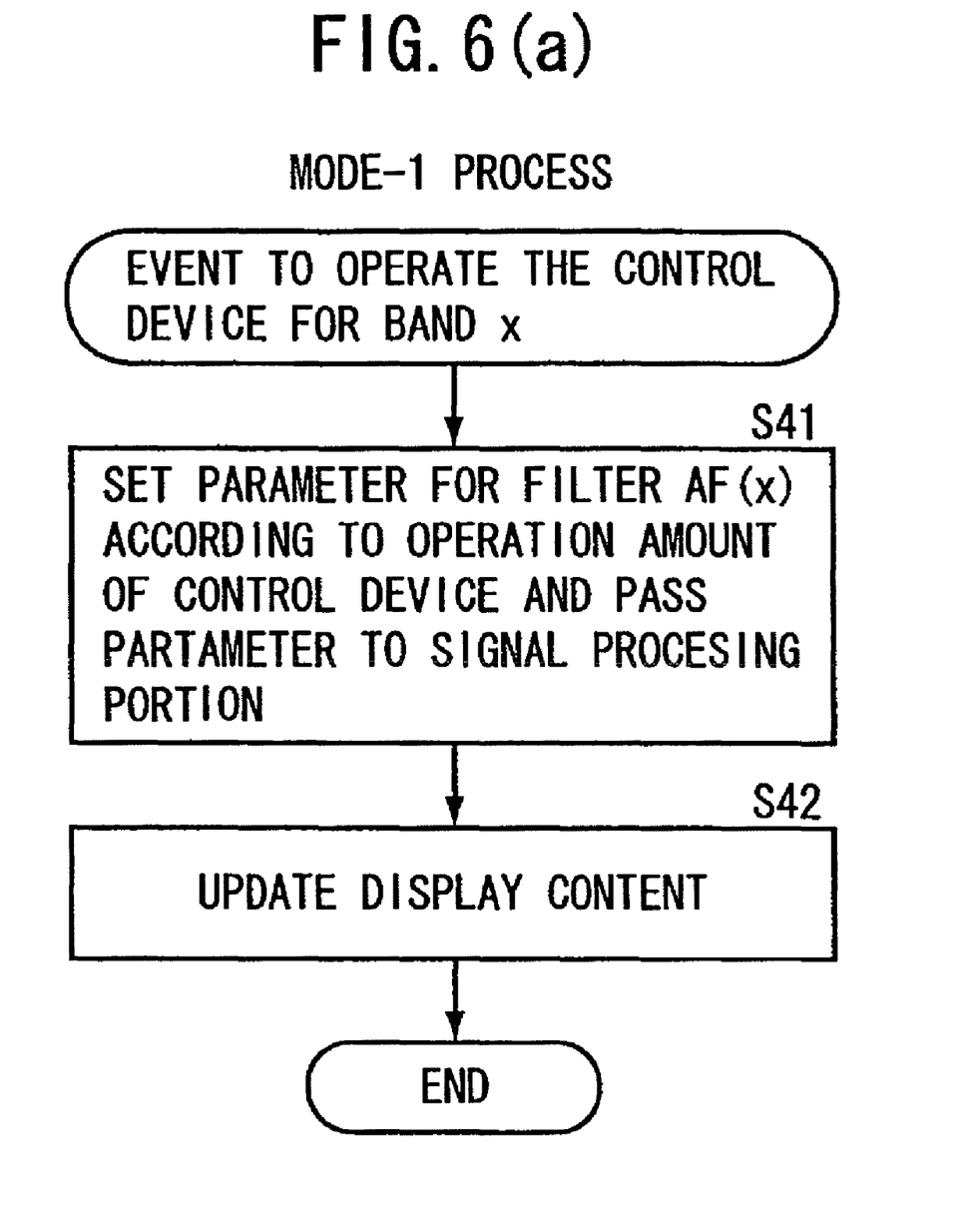
Figure 6B:
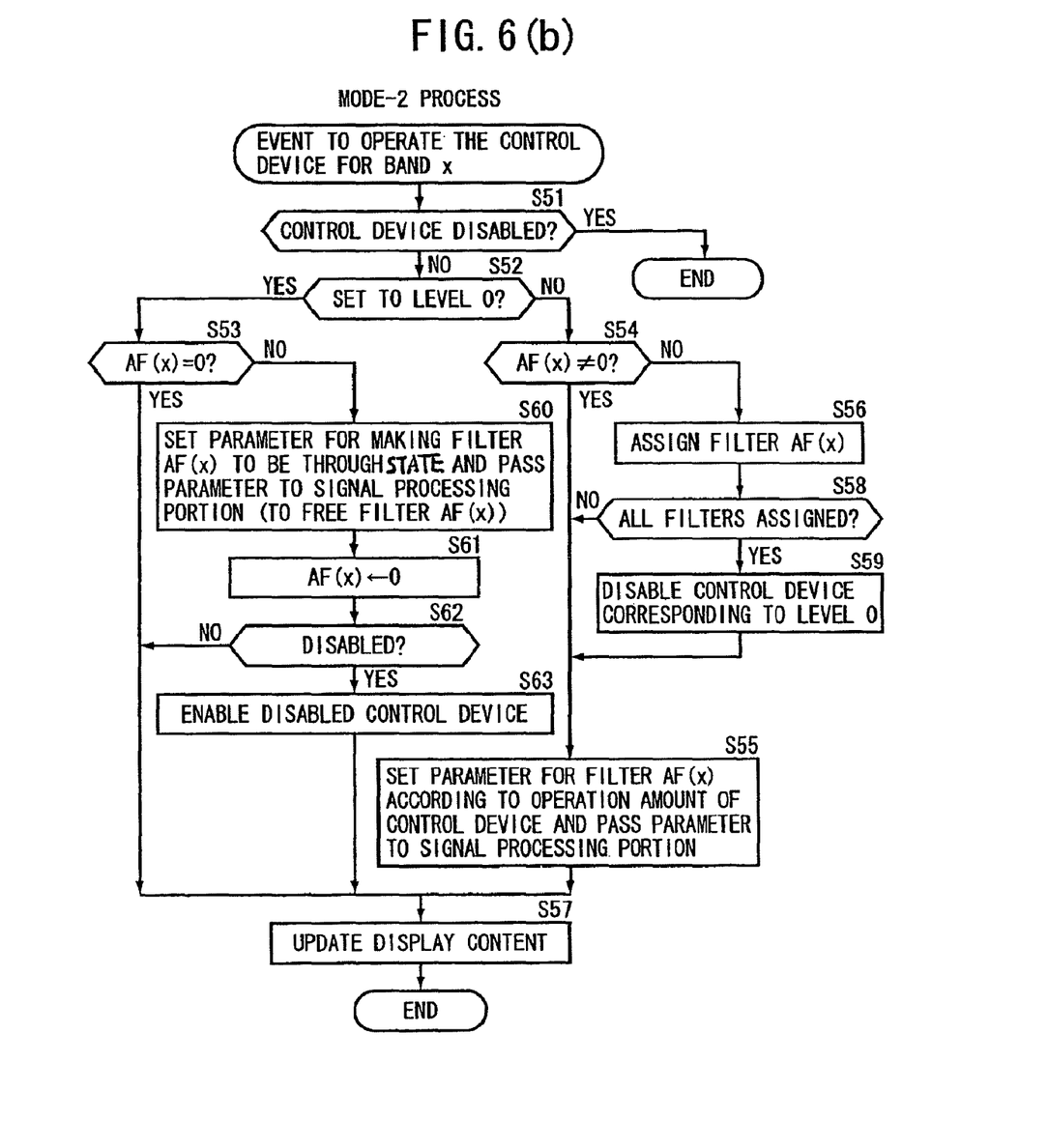

FIGS. 6(*a*) and 6(*b*) are a first flowchart showing a process of the control portion 4 in FIG. 1.

FIG. 6(*a*) assumes the mode-1 graphic equalizer GEQ1. The process starts when detecting an operation event to move fader control device $14_x$ corresponding to band x.

At step S41, the process sets a parameter for filter AF(x) (filter $21_x$: x=1 to 31) to the current memory according to the operation amount and passes the parameter to the signal processing portion 2.

At S42, the process updates the display content of the operation panel display screen 11 as shown in FIG. 2 to move fader control device $14_x$.

FIG. 6(*b*) assumes the mode-2 graphic equalizer GEQ2. The process starts when detecting an event to move fader control device $14_x$ using the mouse.

At S51, the process determines whether or not fader control device $14_x$ is disabled. When the result is affirmative, the process terminates. Otherwise, the process proceeds to S52.

When the correspondence table in FIG. 4(*b*) is used, for example, it is assumed that all filter numbers 1 through 15 are assigned as values of filters AF(1) through AF(31) and that value 0 is supplied to the filter AF(x) assigned with band x corresponding to fader control device $14_x$. This situation indicates that fader control device $14_x$ is disabled.

At S52, the process determines whether or not control device $14_x$ is now used to set band x to level 0 (reference level). When the result is affirmative, the process proceeds to S53. Otherwise, the process proceeds to S54.

First, the following describes a case of setting a level different from level 0. In the example in FIG. 3(*a*), the fader control device $14_7$ is operated to specify a level different from level 0.

At S54, the process references the correspondence table in FIG. 4(*b*) to determine whether or not filter AF(x) is set to 0. In other words, the process determines whether or not fader control device $14_x$ is used to specify a level other than level 0 before fader control device $14_x$ is operated.

When filter AF(x) is not set to 0, the process proceeds to S55. The process sets a parameter for filter AF(x) (filter $21_x$: x=1 to 15) to the current memory according to the operation amount of fader control device $14_x$ and passes the parameter to the signal processing portion 2.

When filter AF(x) is set to 0 at S54, the process proceeds to S56. The process newly assigns filter AF(x) to update the correspondence table in FIG. 4(b).

The fader control device $14_7$ is operated according to the example in FIG. 3(a). Since AF(7) is set to 0 in FIG. 4(b), the process assigns an unassigned filter, e.g., 3, to band 7, thus setting AF(7) to 3.

At S58, the process determines whether or not all filters AF(x)=1 through 15 (filters $21_1$ through $21_{15}$) are already assigned to band x. When the result is affirmative, the process proceeds to S59. Otherwise, the process proceeds to S55 above.

FIG. 3(b) above shows the case where all filters $21_1$ through $21_{15}$ are already assigned when the fader control device $14_2$ is operated.

At S59, the process grays out all the fader control devices $14_1$, $14_3$, $14_6$, $14_8$, ..., $14_{28}$, and $14_{31}$ specifying level 0 to proceed to S55.

When control device $14_x$ is used to set band x to level 0 at S52, the process proceeds to S53.

At S53, the process determines whether or not filter AF(x) is set to 0.

When AF(x) is set to 0, this means that level 0 was set before detection of an operation event to specify level 0. Although such case is impracticable, this step is provided as the countermeasure against a malfunction.

When filter AF(x) is not set to 0 at S53, the process proceeds to S60. The process sets a parameter for making filter AF(x) to be the through state and passes the parameter to the signal processing portion 2.

As a result, the process frees filter AF(x) (filter $21_x$) assigned to band x to provide control that equivalently sets band x to level 0.

At S61, the process supplies value 0 to filter AF(x) assigned with band x in the correspondence table in FIG. 4(b).

At S62, the process determines whether or not the state disables all the fader control devices specifying level 0 as shown in FIG. 3(b). When the result is affirmative, the process proceeds to S63. Otherwise, the process proceeds to S57.

At S63, the process enables the disabled fader control devices. That is, the process is performed so as to be able to detect operation events of these fader control devices during subsequent operations. As a result, the normal display is applied to the fader control devices that specify level 0.

At S57, the process provides the display so that the position of control device 14x is returned to the position of level 0.

Figure 7:
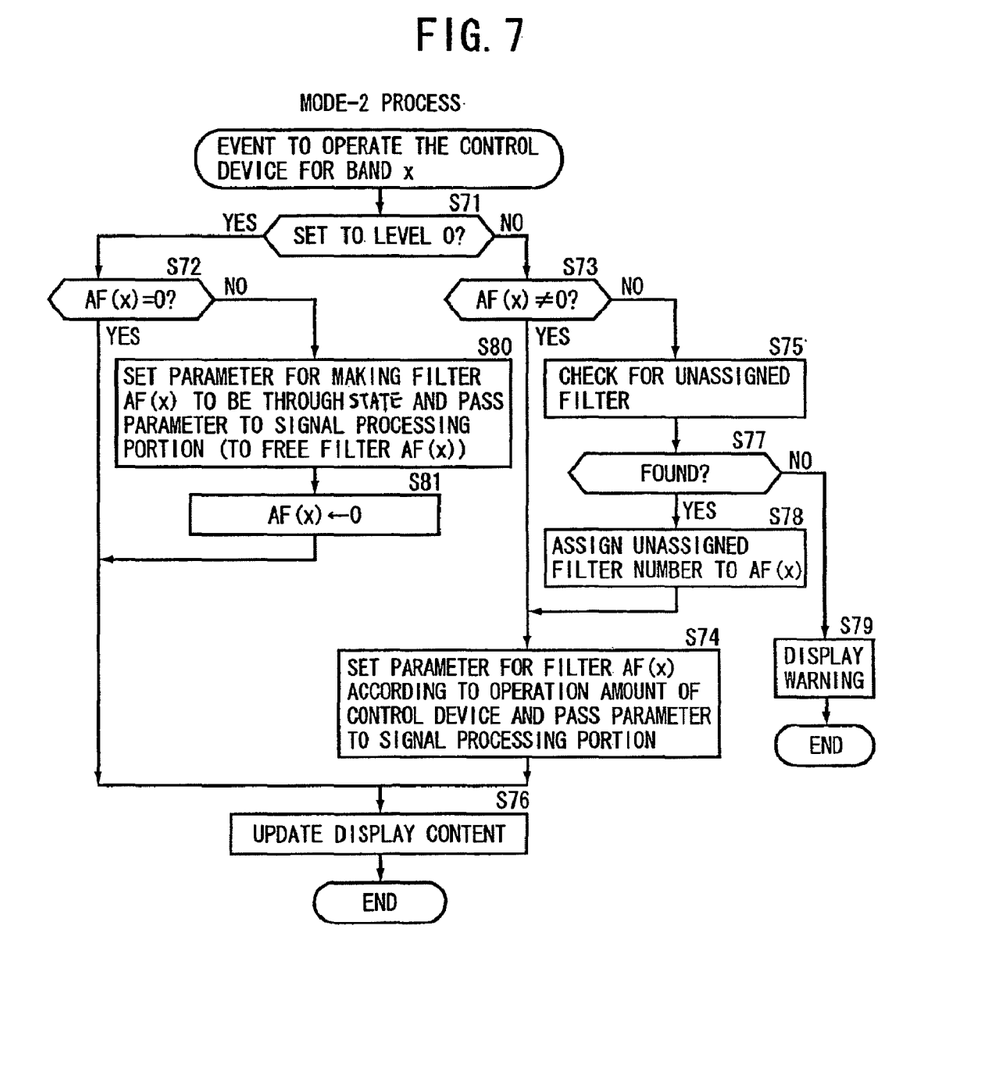
FIG. 7 is a second flowchart showing a process of the control portion in FIG. 1.

FIG. 7 is a second flowchart showing a process of the control portion 4 in FIG. 1.

The flowchart shows the process when the operation inhibiting function is provided instead of the operation disabling function.

The mode-1 process is the same as FIG. 6(a) and a description is omitted.

The flowchart assumes the mode-2 graphic equalizer GEQ1. The process starts when detecting an operation event to move fader control device $14_x$ corresponding to band x.

At S72, the process determines whether or not fader control device $14_x$ is now used to set band x to level 0. When the result is affirmative, the process proceeds to S72.

When band x is not set to level 0, the process proceeds to S73 to determine whether or not filter AF(x) is set to 0. In other words, the process determines whether or not a level other than level 0 is set to band x before the operation of the fader control device $14_x$ is detected.

When filter AF(x) is not set to 0, this means that a level other than level 0 is set. The process then proceeds to S74. The process sets a parameter for filter AF(x) (filter $21_x$) to the current memory according to the operation amount of fader control device $14_x$ and passes the parameter to the signal processing portion 2. At S76, the process updates the display content of the display portion 6.

When filter AF(x) is set to 0, this means that level 0 is set. The process then proceeds to S75 to determine whether or not there remains an unassigned filter.

For example, the present invention searches the correspondence table in FIG. 4(b) for an unassigned filter to which no band is assigned.

When an unassigned filter is found at S77, the process proceeds to S78 to assign the unassigned filter number to AF(x), and then proceeds to S74 as mentioned above.

According to the correspondence table in FIG. 4(b), the fader control device $14_7$ sets band x=7 to level 0. When the unassigned filter number 3 is found, AF(x) is set to 3.

When no unassigned filter is found, the process proceeds to S79. The operation panel display screen 11 displays the warning as shown in FIG. 5(b).

When band x is to be set to level 0 at S71, the process proceeds to S72.

At S72, the process determines whether or not filter AF(x) is set to 0. That is, the process determines whether or not level 0 is set before the operation event is detected. Normally, the process proceeds to S80.

At S80, the process sets a parameter for making filter AF(x) to be the through state and passes the parameter to the signal processing portion 2.

As a result, the process frees filter $21_x$ specified by filter AF(x).

At S81, the process supplies value 0 to filter AF(x) assigned with band x in the correspondence table in FIG. 4(b).

At S76, the process allows the display portion 6 to display the position of control device $14_x$ set to level 0.

After the warning at S79 is displayed, it is impossible to operate the fader control devices $14_1$, $14_3$, $14_{31}$, and the like specifying level 0.

The fader control devices $14_1$ through $14_{31}$ may indicate levels slightly different from level 0. In such case, a user may not be able to determine at a glance whether or not the fader control device indicates level 0. The conventional graphic equalizer has a display portion that numerically displays each band level. However, the user needs to read respective numeric values until ensuring the reference level.

Even when the warning is issued, the user may want to move the other control devices from the reference level but may feel it difficult to select fader control devices that can be returned to the reference level.

To solve this problem, it may be preferable to provide the operation panel display screen with a display portion corresponding to each fader control device. The control portion 4 in FIG. 1 may be preferably provided with a display mode control function that switches between first and second display modes. The first display mode activates the display portion corresponding to fader control devices that specify level 0. Unlike the first display mode, the second display mode activates the display portion corresponding to fader control devices that specify levels other than level 0.

Figure 8A:
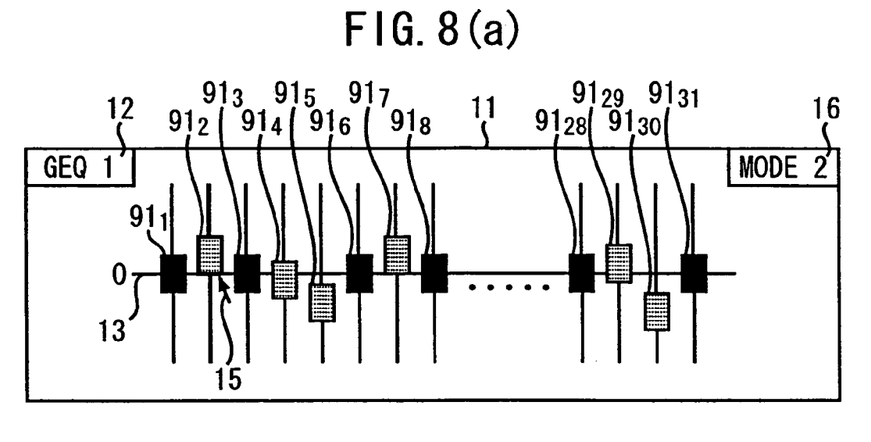
Figure 8B:
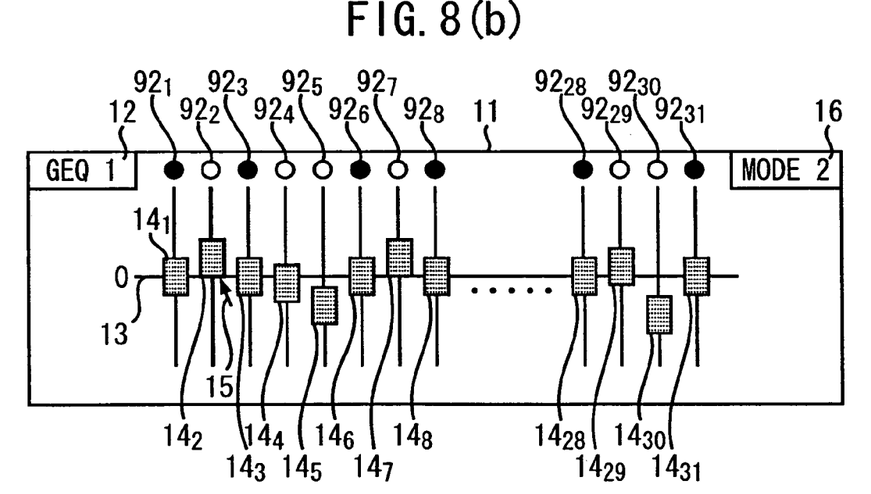

FIGS. 8(a) and 8(b) are an explanatory diagram showing another example of the mode-2 operation panel display screen displayed on the display portion 6 in FIG. 1 when the operation inhibiting function is provided.

In FIG. 8(a), the fader control devices $91_1$, $91_3$, $91_6$, $91_8$, ..., $91_{28}$, and $91_{31}$ specify level 0 and correspond to the bands assigned with no filters. The fader control devices $91_2$, $91_4$, $91_5$, $91_7$, ..., $91_{29}$, and $91_{30}$ specify the levels other than level 0 and correspond to the bands assigned with filters.

These control devices are identified by changing colors of the graphic symbol representing the control device. It may be preferable to change the shape of the control device's display portion.

FIG. 8(b) provides indicator-type display symbols $92_1$ through $92_{31}$ near the fader control devices $14_1$ through $14_{31}$. The display portions $92_1$ through $92_{31}$ indicate corresponding display modes in different colors, for example, to identify whether or not the fader control devices specify level 0.

While there has been described the advantage of controlling the display modes after the warning is issued, the display mode control function may provide the normal display mode of the operation panel display screen 11. Even before the warning is issued, it becomes easy to determine whether or not the fader control device specifies the reference level.

The mode-2 operation panel display screen 11 in FIG. 3 has no warning display function. This screen may likewise control the display modes by displaying the fader control devices $91_1$ through $91_{31}$ as shown in FIG. 8 or providing the separate symbols $92_1$ through $92_{31}$.

Let us return to FIG. 5(b). When the warning is issued, one or more bands may be set to levels other than the reference level. It may be preferable to automatically select and display candidate bands (e.g., those approximate to the reference level) that can be forcibly returned to the reference level. When the user selects one of the candidate bands, the filter assigned to the band may be changed to the through state. Further, it may be preferable to assign the filter to the band corresponding to the fader control device $14_3$ that was first intended to move from the reference level so as to be able to operate the control device.

It may be preferable to enable the through state or change the assignment without displaying candidates.

The above-mentioned description provides two modes. However, only mode 2 may be used to provide the graphic equalizer controller that uses fewer digital filters than bands. In this case, only one graphic equalizer may be created and controlled. An extra DSP throughput, if any, can be used for signal processes to implement other functions than the filter function.

In the above-mentioned description, the graphic equalizers GEQ1 and GEQ2 in the second mode each have the same number (m) of constituent filters in total. The filter configuration is easily understandable to users.

However, for example, the graphic equalizer GEQ1 may be composed of 15 filters. The graphic equalizer GEQ2 may be composed of 16 filters. The graphic equalizer GEQ1 and GEQ2 may each have different number of bands.

The number of graphic equalizers GEQs provided in the second mode is not limited to 2 and may be more.

In mode 1, it is not necessary to use all the filters provided. For example, there may be provided 32 filters. Mode 1 may provide the 31-band graphic equalizer GEQ1 using 31 filters. Mode 2 may provide the 31-band graphic equalizer GEQ1 using 16 filters.

It may be also preferable to provide three or more modes and change the number of graphic equalizers depending on modes.

In the above-mentioned description, multiple prepared filters are divided into a specified number of filter groups during the mode selection to create one or more graphic equalizers. Afterwards, bands are assigned to the corresponding graphic equalizers.

In this case, different number of bands may be assigned to the graphic equalizers created in mode 2. The filters may be used inefficiently.

To solve this problem, it may be preferable to assign the filters and make connections between them as well to create multiple graphic equalizers.

When there are provided n filters, for example, these filters are individually assigned to the variable number of (i) j-band graphic equalizers GEQs. In terms of the assignment, let us suppose that a given graphic equalizer GEQ corresponds to a given band. The fader control device is operated to specify that band with a level other than the reference level. At each occurrence of this operation, an unassigned filter is assigned to the band of that graphic equalizer GEQ. This method does not previously group n filters and may not fix the number of j-band graphic equalizers GEQs. According to the configuration of each graphic equalizer GEQ, the number of filters is variable. Filters are used only for necessary bands. There is no filter held in the through state. It is possible to improve efficiency in the use of filters.

Since the graphic equalizer GEQ is created by assigning the filters, it is necessary to dynamically change the wire connections between filters at each occurrence of the filter assignment. In consideration for this, action needs to be taken to prevent noise from occurring even when the wire connections are changed while processing signals.

According to the above-mentioned description, the microprogram-driven DSP is used as the signal processing portion 2 in FIG. 1. Instead, it may be preferable to use a semiconductor integrated circuit that uses an arithmetic circuit to provide each filter and is capable of freely setting coefficients. A special-purpose semiconductor integrated circuit may be internally configured as the DSP operating on a dedicated microprogram.

Any semiconductor integrated circuit has a limitation on the total number of available filters in terms of the hardware. It is possible to efficiently use the filters fewer than bands similarly to the above-mentioned embodiment using the DSP.

According to the above-mentioned description, the operation panel display screen 11 of the display portion 6 in FIG. 1 displays the fader control devices $14_1$ through $14_{31}$. The pointing device is used to manipulate these fader control devices. It may be preferable to display differently shaped control devices.

The fader control devices $14_1$ through $14_{31}$ may be physical control devices arranged on a front panel of the apparatus. The user can directly operate these control devices. Generally, fader control devices are used as control devices but not limited thereto.

When physical fader control devices are used, a mechanical break mechanism just needs to be provided to prevent the fader control devices from being moved instead of disabling operations of the fader control devices as shown in FIG. 3(b) or inhibiting operations thereof as shown in FIG. 5(b).

A lamp may be embedded in the mechanical fader control device for self-illumination to change display modes of the fader control device. Instead of the grayed-out display in FIG. 3(b), a lamp can be mounted on the control panel near the fader control device to indicate that the fader control device is disabled. This method can replace the display screen control in FIG. 8 to identify whether or not the fader control device specifies the reference level.

While the warning in FIG. 5(b) is displayed on the display portion 6, the front panel may be provided with a warning lamp.

The invention claimed is:

1. An apparatus for controlling a graphic equalizer which is implemented by digital filters, each digital filter being assignable to a frequency band for regulating a level of the frequency band by means of a set of corresponding control devices, each control device being operable to specify the level of the corresponding frequency band to either a reference level or a level other than the reference level, the apparatus comprising:

an assignment device operative when a number of the digital filters is less than a total number of the frequency bands, for assigning the digital filters to the frequency bands which are specified with levels other than the reference level by the corresponding control devices;

a control device that controls each the assigned digital filters to regulate the corresponding frequency band to the level specified by the corresponding control device, and that controls digital filters which are not assigned to any of the frequency bands in a through state; and a disabling device operative when the assignment device assigns all of the digital filters to the frequency bands which are specified with levels other than the reference level, for disabling operation of a control specifying the reference level.

2. The apparatus according to claim 1, wherein the disabling device holds all of the control devices which currently specify the reference level in a disabled state and visually indicates the disabled state of all the control devices which currently specify the reference level.

3. The apparatus according to claim 1, wherein the disabling device operates when an attempt is made to operate the control device which currently specifies the reference level for inhibiting the operation of the control device and displaying warning that the operation is inhibited.

4. The apparatus according to claim 1, further comprising a display control device that provides a set of graphic symbols corresponding to the set of the control devices, and that applies a first display mode to the graphic symbols corresponding to the control devices which specify other levels than the reference level and applies a second display mode different from the first display mode to the remaining graphic symbols corresponding to the control devices which specify the reference level.

5. An apparatus for controlling a graphic equalizer which is implemented by digital filters, each digital filter being assignable to a frequency band for regulating a level of the frequency band by means of a set of corresponding control devices, each control device being operable to specify the level of the corresponding frequency band to either a reference level or a level other than the reference level, the apparatus comprising:

an assignment device operative, when a number of the digital filters is less than a total number of the frequency bands, for assigning the digital filters to the frequency bands which are specified with levels other than the reference level by the corresponding control devices;

a control device that controls each assigned digital filter to regulate the corresponding frequency band to the level specified by the corresponding control device, and that controls digital filters which are not assigned to any of the frequency bands in a through state; and a mode setup device that enables a user to set either of two modes, a first mode being set to implement one graphic equalizer by the plurality of the digital filters which are not less than the total number of the frequency bands of the graphic equalizer, a second mode being set to implement two or more of graphic equalizers by the digital filters such that the plurality of the digital filters are divided into two or more of groups in correspondence to the two or more of the graphic equalizers so that the number of the digital filters of one group corresponding to one graphic equalizer is less than the total number of the frequency bands of the graphic equalizer, wherein under the first mode, the assignment device assigns the digital filters to all of the frequency bands in one to one correspondence, and the control devices controls each digital filter to regulate each frequency band to the level specified by the corresponding control device, and wherein under the second mode, the assignment device assigns the digital filters only to the frequency bands specified with levels other than the reference level, the control device controls the remaining digital filters which are not assigned to any of the frequency bands in the trough state, and the disabling device disables operation of a control device which currently specifies the reference level in one digital equalizer when the assignment device assigns all of the digital filters in the corresponding group to the frequency bands which are specified with levels other than the reference level.

6. A method of controlling a graphic equalizer which is implemented by digital filters, each digital filter being assignable to a frequency band for regulating a level of the frequency band by means of a set of corresponding control devices, each control device being operable to specify the level of the corresponding frequency band to either a reference level or a level other than the reference level, the method comprising the steps of:

assigning the digital filters to the frequency bands which are specified with levels other than the reference level by the corresponding control devices when a number of the digital filters is less than a total number of the frequency bands;

controlling each assigned digital filter to regulate the corresponding frequency band to the level specified by the corresponding control device, and controlling digital filters which are not assigned to any of the frequency bands in a through state; and disabling operation of a control device which currently specifies the reference level when all of the digital filters are assigned to the frequency bands specified with levels other than the reference level.

7. A machine readable medium containing a program executable by a computer for performing a method of controlling a graphic equalizer which is implemented by digital filters, each digital filter being assignable to a frequency band for regulating a level of the frequency band by means of a set of corresponding control devices, each control device being operable to specify the level of the corresponding frequency band to either a reference level or a level other than the reference level, wherein the method comprises the steps of:

assigning the digital filters to the frequency bands which are specified with the levels other than the reference level by the corresponding control devices when a number of the digital filters is less than a total number of the frequency bands;

controlling each assigned digital filter to regulate the corresponding frequency band to the level specified by the corresponding control device, and controlling digital filters which are not assigned to any of the frequency bands in a through state; and disabling operation of a control device which currently specifies the reference level when all of the digital filters are assigned to the frequency bands specified with levels other than the reference level.

\* \* \* \* \*